United States Patent
Kohler et al.

(10) Patent No.: US 7,742,355 B2
(45) Date of Patent: Jun. 22, 2010

(54) DYNAMIC RANDOM ACCESS MEMORY WITH LOW-POWER REFRESH

(75) Inventors: Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 237 days.

(21) Appl. No.: 11/962,035

(22) Filed: Dec. 20, 2007

(65) Prior Publication Data

US 2009/0161459 A1    Jun. 25, 2009

(51) Int. Cl.
*G11C 7/00* (2006.01)
(52) U.S. Cl. ............... 365/222; 365/201; 365/185.08; 365/189.07; 365/230.09
(58) Field of Classification Search ............... 365/222, 365/185.08, 201, 189.07, 230.09; 711/156
See application file for complete search history.

(56) References Cited

U.S. PATENT DOCUMENTS 6,778,457 B1 * 8/2004 Burgan .................. 365/222
7,116,602 B2 * 10/2006 Klein .................... 365/222

* cited by examiner

*Primary Examiner*—Pho M Luu
*Assistant Examiner*—Tha-O Bui

(57) ABSTRACT

A technique to reduce refresh power in a DRAM. In one embodiment, all of the DRAM memory cells are refreshed at a first rate and a subset of the memory cells are refreshed a second rate greater than the first rate. In another embodiment, the DRAM has a refresh controller that generates a refresh address and controls the refresh of the memory cells addressed by the refresh address. A marker memory is used by the refresh controller to determine which of the memory cells requires refreshing at a rate faster than the refresh rate of the remaining memory cells. Testing the DRAM uses a method to determine which of the memory cells are to be refreshed at the faster rate and to store the results in the marker memory.

15 Claims, 3 Drawing Sheets

DYNAMIC RANDOM ACCESS MEMORY WITH LOW-POWER REFRESH

TECHNICAL FIELD

The present invention relates to semiconductor memory and, more specifically, to a dynamic random access memory or the like.

BACKGROUND

Dynamic Random Access Memory (DRAM), either as an embedded DRAM or as a stand-alone DRAM, is widely used in a variety of applications because the density of the memory (the number of bits that can be stored in the memory per $mm^2$) is the highest of all semiconductor memory technologies. A typical large DRAM memory has blocks of memory cells, the cells disposed in rows and columns within each block. A typical DRAM memory cell comprises a storage capacitor and an access transistor. The capacitor stores a charge related to the value of the data stored in the cell and the access transistor selectively couples the storage capacitor to a column conductor (also referred to as a "bit line") for reading and writing the memory cell. Because of various leakage paths, the charge on the storage capacitor will typically dissipate in less than a few tens of milliseconds. To maintain integrity of the data in the memory, each cell is periodically "refreshed" to maintain the data therein by reading the data in the memory cell and rewriting the read ("refreshed") data back into the cell before a charge stored in the storage capacitor has had the opportunity to dissipate. Because of the large number of memory cells (e.g., 16 million) and the row-column structure of the memory, a typical DRAM is designed to refresh all the memory cells in a row at a time. This is known as a row-only or row-by-row refresh, where the entire memory is refreshed by sequencing through all the rows in the memory.

DRAM manufacturers typically specify a maximum interval between refreshes of any row and the interval is same for all rows. The interval is set short enough (typically less than a millisecond) to assure that the "weak" cells in the memory (i.e., those cells with the highest leakage rates, compared to the other ("normal") memory cells in the DRAM, for all operating temperature and power supply voltage conditions) will not lose any data stored therein. Usually, the length of the refresh interval is based upon a small percentage of the memory cells and is much shorter than necessary for the majority of memory cells in the memory. For one exemplary DRAM, if all the memory cells are refreshed every 100 microseconds, none of the memory cells will fail (i.e., lose data). If, however, the refresh interval is lengthened to one millisecond, then some of the memory cells will fail. Thus in this example, the memory is refreshed every 0.1 milliseconds so that the memory does not lose any of the data stored therein, resulting in a much higher refresh rate than required for the majority of memory cells. The high refresh rate results in relatively high refresh power consumption. Battery operated electronic devices, such as cell phones and multimedia players, require as low as possible power consumption by the memories therein to prolong battery life. Because these applications do not read or write (access) the memory most of the time, very low memory standby power is desirable. A major component of memory standby power is the refresh power. Thus it is desirable to reduce refresh power to very low levels.

One approach reducing refresh power is to replace the memory elements (e.g., whole rows or columns or entire memory blocks) having the weak cells with spare memory elements having no weak cells, and the memory is refreshed using a lower refresh rate than would otherwise be required. Having spare memory elements adds additional silicon area, and therefore cost, to the DRAM.

Another approach is to use error correction techniques (ECC) to correct erroneous data from failing cells while using a lower refresh rate than would otherwise be required. This requires additional circuitry and memory cells (ECC cells) to be added to the memory, increasing silicon area and, thus, cost. In addition, ECC may require extra time during memory reads to detect and correct errors and during memory writes to calculate the ECC data, as well as increasing power consumption during read and write cycles of the memory.

SUMMARY

In one embodiment, the present invention is a method of refreshing a dynamic memory having a plurality of memory cells. The method comprises the steps of 1) refreshing all of the memory cells at a first rate, and 2) refreshing a subset of the memory cells at a second rate. The second rate is greater than the first rate.

In still another embodiment, the present invention is a dynamic memory comprising a plurality of memory cells and a refresh controller. The refresh controller causes all of the memory cells to be refreshed at a first rate and a subset of the memory cells to be refreshed at a second rate. The second rate is greater than the first rate.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

For purposes here, signals and corresponding nodes, ports, inputs, or outputs may be referred to by the same name and are interchangeable. Similarly, the contents of a register and the register's name may be referred to by the same name and are interchangeable. It is also understood that a "refresh interval," as used herein, has an equivalent "refresh rate" that is approximately the reciprocal of the refresh interval, e.g., for a refresh interval of one millisecond, the approximate refresh rate is $10^3$ $sec^{-1}$.

Figure 1:
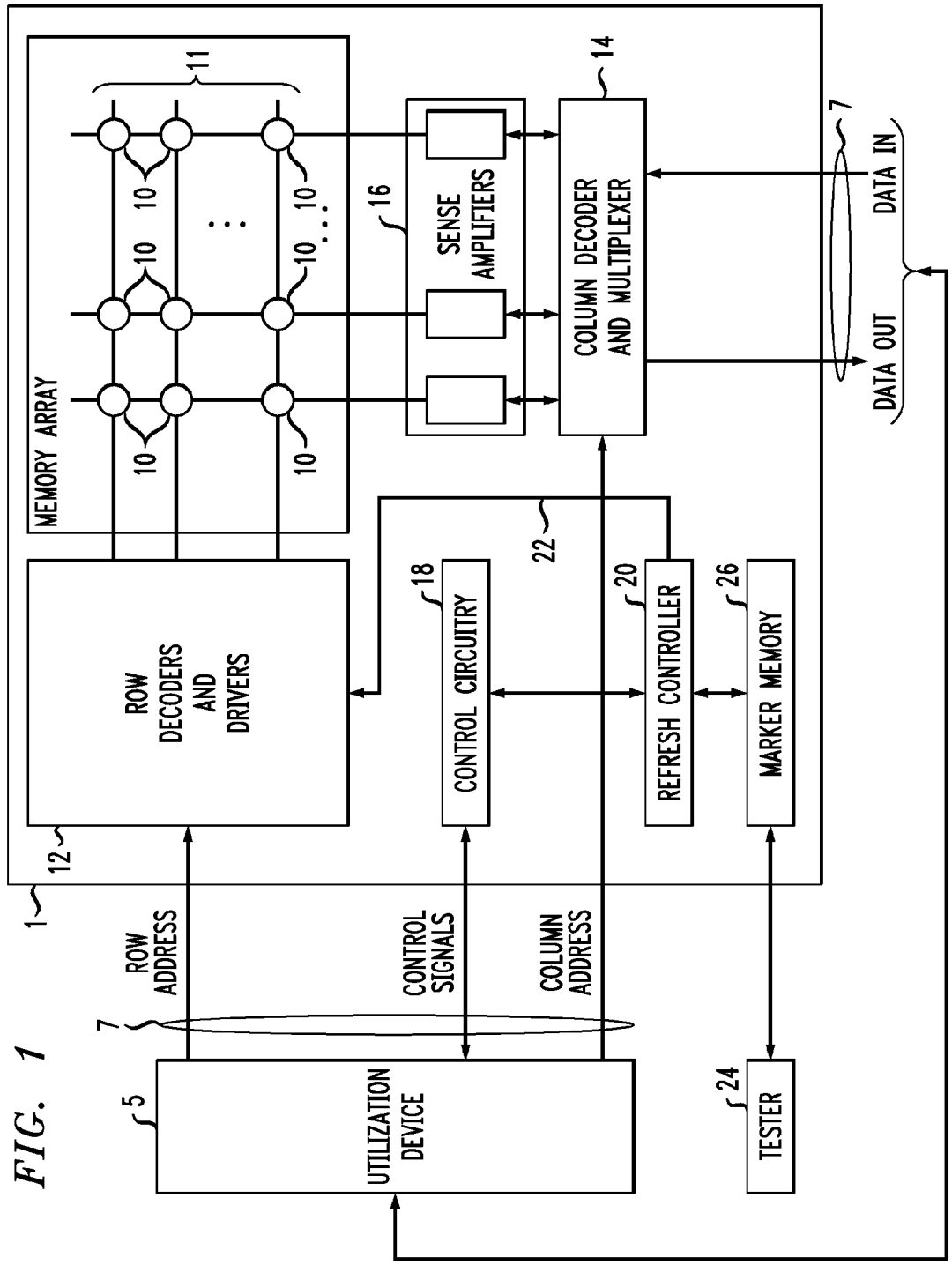
FIG. 1 is a simplified block diagram of a system having a dynamic random-access semiconductor memory according to one exemplary embodiment of the present invention.

An exemplary embodiment of the invention is shown in FIG. 1. An exemplary DRAM memory 1, coupled to a utilization device 5 such as a processor or DSP via a bus 7, has an array of conventional memory cells 10 with row decoders/drivers 12, a column decoder/multiplexer 14, and sense amplifiers 16. Control circuitry 18 receives and sends control signals (e.g., clock, read, write, output enable, data ready, etc.) via bus 7 and provides the proper internal control signals to the various circuits in the memory 1 for the memory 1 to perform read, write, refresh, or idle (NOOP) cycles. The memory 1 is an array organized into N rows and M columns although for large memory organizations (e.g., memories capable of storing more than one megabit of data) the memory may be further organized into multiple blocks or banks of memory arrays.

Operation and structure of the cells 10, decoders 12, 14, and sense amplifiers 16 are well known and will not be described further herein. However, the control circuitry 18, also well known, additionally receives refresh requests and sends status information and clock signals to refresh controller 20, described below.

Refresh controller 20, coupled to the control circuitry 18 and a marker memory 26, determines when and which of the memory cells 10 are to be refreshed. In this example, the memory 1 is organized in rows and columns of memory cells 10, and the memory cells 10 are refreshed with a row-by-row refresh process, i.e., all the memory cells in a given row 11 are refreshed substantially simultaneously. The control circuitry 18, during times in which the memory 1 is otherwise idle and in response to the refresh controller 20, refreshes one row 11 at a time using a refresh address supplied by the refresh controller 20. As will be explained in more detail in connection with FIG. 2, the refresh controller 20, in conjunction with the marker memory 26 having N entries therein (discussed below) and addressed using the refresh address, initiates refresh sequences (each refresh sequence having multiple refresh cycles) more often for those rows having weak memory cells than for rows 11 having all normal memory cells. In this embodiment, the controller 20 initiates a major refresh sequence (when all the rows 11 are refreshed) after a certain number of minor refresh sequences (when only those rows having weak memory cells are refreshed) have occurred. For example for one commercially available embedded DRAM, if all the memory cells are refreshed every 100 microseconds, none of the memory cells will fail (i.e., lose data). However, if the refresh interval is lengthened to one millisecond, approximately 0.1% of the memory cells will fail. Still further, if the refresh interval is lengthened to 10 milliseconds, approximately 1000 of the memory cells will fail. For this exemplary memory, if the minor refresh interval is once every 0.1 millisecond (equivalent to a refresh rate of $10^4$ sec$^{-1}$) and the major refresh interval is once every 10 milliseconds (equivalent to a refresh rate of $10^2$ sec$^{-1}$), then the refresh controller 20 initiates approximately ninety-nine minor refresh sequences and, during what would be a one-hundredth minor refresh interval, the controller 20 initiates a major refresh sequence.

As will be explained in more detail below, each major refresh sequence refreshes all of the memory cells 10, while each minor refresh sequence refreshes the memory cells 10 in a subset of rows 11. The marker memory 26 has entries therein to indicate which rows 11 are to be refreshed during the minor refresh sequence and are, therefore, refreshed more frequently than the other rows. Thus, a subset of the memory cells 10 (or rows 11) is refreshed at a faster rate than all of the other memory cells (or rows). Advantageously, the use of two or more different refresh rates allows the refresh power consumed by the memory 1 to be less than the refresh power consumed by the memory 1 using a single fixed refresh rate fast enough to maintain the weakest of all the memory cells 10.

In this embodiment, the marker memory 26 is a non-volatile memory with N locations and may be separate from the memory array 10. The memory 26 stores a value (marker) for each row 11 to indicate whether or not that row has a weak memory cell. As will be discussed in more detail in connection with FIG. 3 and in one example, the memory 1 is tested by testing apparatus 24 at various temperatures and power supply voltages after manufacture of the memory 1 to determine, assuming the memory 1 is functional, which of the rows 11, if any, have weak cells, and programs memory 26 accordingly. Alternatively, instead of having a separate memory 26, each row 11 may have one or more additional memory cells for storing the marker information for that row. Exemplary technologies for the memory 26 include a programmable memory, such as a floating gate memory (one-time programmable or multiple-time programmable), an electrically programmable fuse memory, or a laser-programmable fuse memory. Each entry in the memory 26 may be a single bit for a simple major/minor distinction for each row 11, or may have multiple bits to provide additional refresh time intervals.

The tester 24 may be implemented on the integrated circuit having the memory 1 therein testing in the field (as described in more detail below) or the tester 24 is separate from the memory 1 for more comprehensive testing of the memory 1.

It is understood that the refresh controller 20 may be implemented as hard-wired logic circuitry, a state machine, or a processor executing a software routine.

Figure 2:
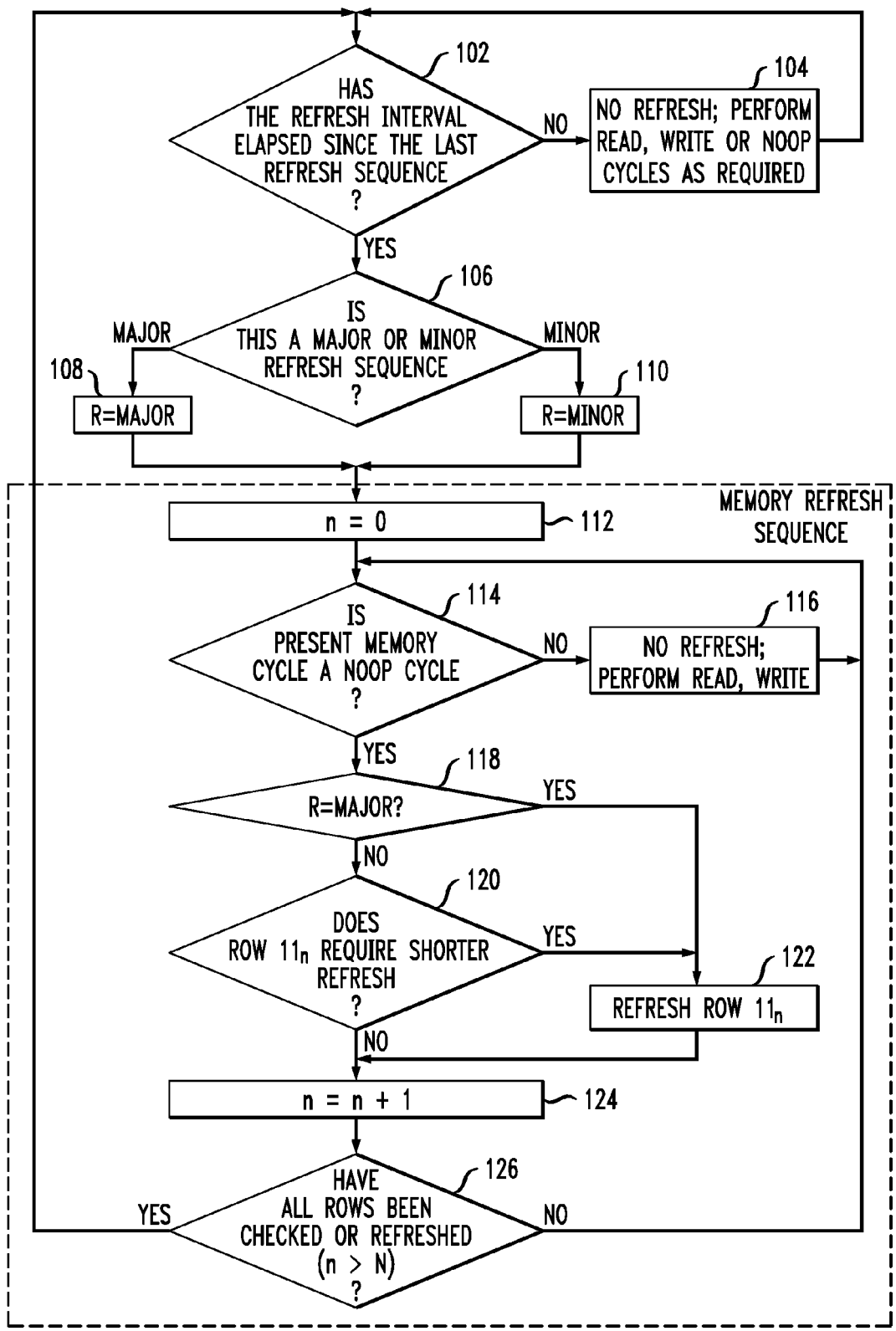
FIG. 2 is a simplified, high-level flowchart of an exemplary refresh process for the memory of FIG. 1.

An exemplary memory refresh process 100 for the memory 1 of FIG. 1 is shown in FIG. 2. Starting with steps 102 and 104, the refresh circuitry 20 (FIG. 1) waits until the shorter refresh interval (minor) has elapsed, during which time the memory is available to the utilization device 5 (FIG. 1) as needed. Upon the minor refresh interval elapsing, then a flag R is set in steps 108 or 110 in accordance to whether the refresh sequence is to be a major or minor refresh sequence, as determined in step 106 and described in more detail below. Then a memory refresh sequence starts with step 112 in which a row refresh address counter or register (not shown) is reset to zero (or some other starting value) and the refresh controller 20, in step 114, checks the control circuitry 18 (FIG. 1) to see if the memory 1 is idle (in a NOOP cycle). If the memory 1 is busy (doing a read or write cycle), then in step 116 the controller 20 waits until a read or write cycle of memory 1 is finished, and the status of the memory 1 is checked again in step 114. If the memory 1 is idle, then in step 118 the controller 20 checks to see if a major refresh cycle is to occur (R is set to major) and, if so, then control passes to step 122 as described below. If, however, R is set to minor, then the controller 20 reads marker memory 26 to determine whether the row $11_n$ ($0 \leq n < N$) requires refreshing using the shorter (minor) refresh interval. If so or the present refresh cycle is a major refresh sequence (R=major), then the controller 20 refreshes row $11_n$ in step 122 by supplying the row address to the row decoder/driver 12 via bus 22 (FIG. 1) and the control circuitry 18 executes a refresh cycle. If the present refresh sequence is a minor sequence and the row $11_n$ does not require the shorter refresh interval (as determined from the value read from the marker memory 26), then the refresh step 122 is skipped and, in step 124, the refresh row address incremented. Then, in step 126, the refresh row address is checked to see if all of the rows have been checked or refreshed. If not, control passes back to step 114. If the refresh sequence is finished, then control passes back to step 102 and the controller waits for the minor refresh time interval to elapse.

In step 106, determination of the when a major or minor refresh sequence may be determined as stated above by forcing a major refresh sequence after a specified number of minor refresh sequences. Alternatively, minor sequences are performed until a major sequence is forced in response to, for example, a timer. Other implementations are possible.

Figure 3:
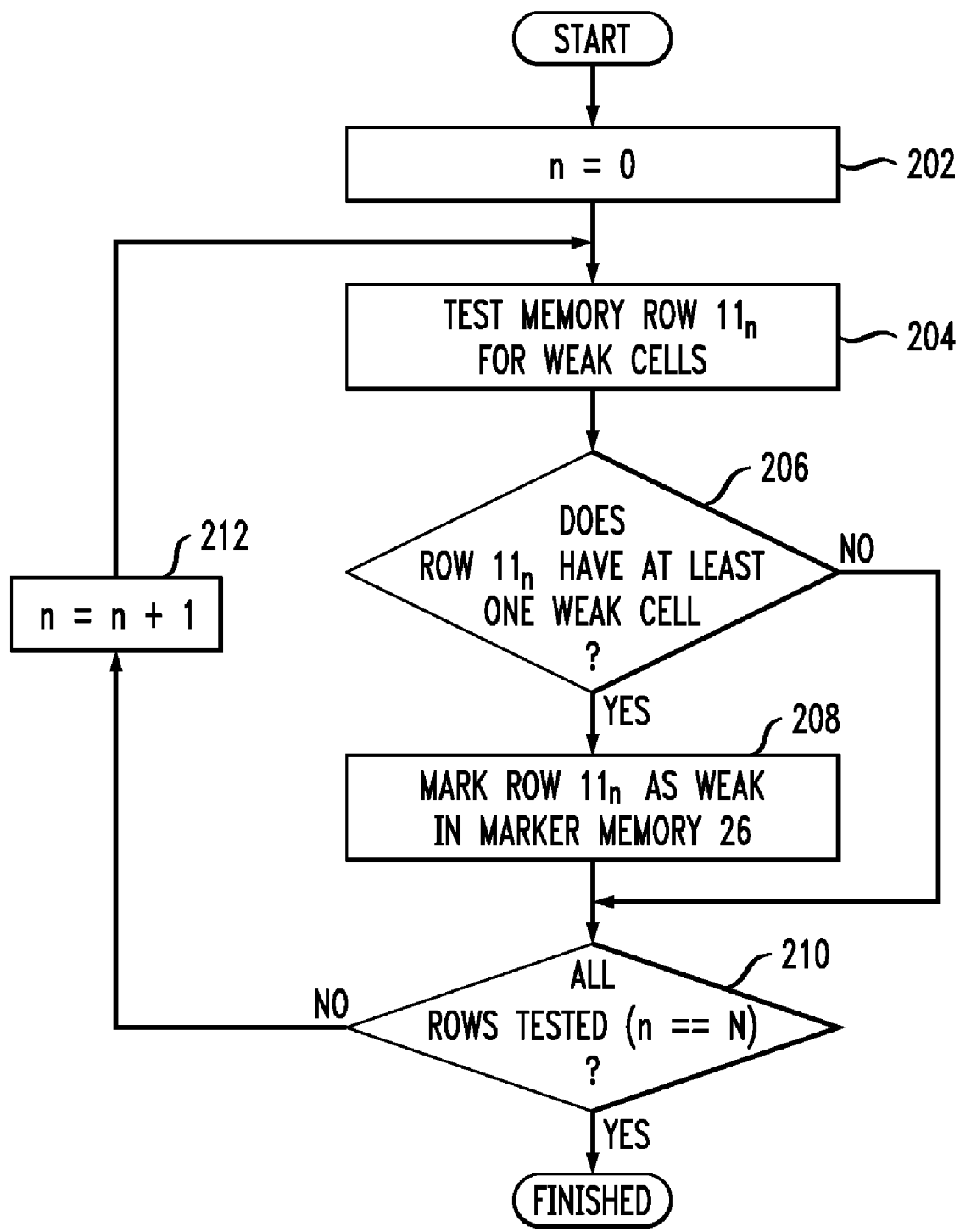
FIG. 3 is a simplified, high-level flowchart of an exemplary technique for determining and writing weak memory cell information into a marker memory shown in FIG. 1.

Referring to FIG. 3, an exemplary process 200 for testing the memory 1 (FIG. 1) to identify the weak cells of the memory cells 10, and writing the results into the marker memory 26 (FIG. 1) is shown. The exemplary process 200 is typically executed on a testing apparatus 24 (FIG. 1) in which the memory 1 is tested over all expected operating temperatures and power supply voltages to find the worst-case operating conditions for the memory, e.g., high temperature and low voltage. Beginning with step 202, a memory row address pointer is initially set to zero. In step 204, the memory cells in row $11_n$ are tested for data retention using one or more conventional data retention tests at a refresh test rate. In one embodiment, the rows 11 are divided into two categories: those that need refreshing more frequently than the refresh test rate (weak memory cells) and those that need refresh less frequently than the refresh test rate (normal memory cells). It is understood that more than one refresh test rate may be used during the data retention tests to further identify the refresh rates needed for the memory cells. In step 206, if any of the cells in row $11_n$ are tested as weak in step 204, then control passes to step 208 and a corresponding entry in the marker memory 26 is written, and control then passes to step 210. It is understood that the entry written into the marker memory 26 in step 208 may also indicate that the cells in the row $11_n$ are all normal. If, however, there were no weak cells in the row being tested, control passes directly to step 210 and nothing is entered in the marker memory 26. In step 210, the row address checked to see if all of the rows have been tested and, if not, the address pointer is incremented in step 212 and the next memory row is tested in step 204. If in step 210 it was determined that all the rows have been tested, then the process 200 terminates.

The exemplary process 200 has the advantage of programming the marker memory 26 at the time of factory testing. In this case, power to the memory 1 will be removed after testing and prior to field use, requiring the use of a non-volatile memory 26. An alterative approach uses a volatile marker memory 26 (either as part of the memory array 10 or separate therefrom), such as a static or dynamic random access memory, that would need to be written each time the memory 1 is powered up. In this case, a Built-In-Self-Test (BIST) circuit (not shown) would perform the exemplary process 200 and the volatile marker memory written accordingly.

Testing the memory 1 for weak cells in step 204 may optionally include disturb tests. DRAM disturb tests, as known in the art, are a subgroup of data retention tests and memory cells that fail disturb tests are cells that fail data retention, i.e., are weak cells.

It is understood that more than two different refresh intervals (or refresh rates) may be used. For example, there may be more than two refresh intervals, e.g., four, with the marker memory having two or more bits for each row in the memory array 10. In addition, the invention may be implemented using other memory refresh techniques, such as by a memory cell-by-memory cell technique or by a partial-row refresh technique.

Advantageously, all of the circuitry of the memory 1 and the utilization device 5 may be implemented in one or more integrated circuits. Further, the refresh controller 20 may be implemented on one or more integrated circuits separate from the memory 1.

Although the present invention has been described in the context of a stand-alone DRAM or an embedded DRAM storage system, those skilled in the art will understand that the present invention can be implemented in the context of other types of DRAM storage systems or applications.

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

It is understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A dynamic memory comprising:
a plurality of memory cells;
a refresh controller adapted to refresh all of the memory cells at a first rate and refresh a subset of the memory cells at a second rate;
wherein the second rate is greater than the first rate;
wherein the refresh controller is further adapted, for all the memory cells in the dynamic memory and at the second rate, to: 1) generate a refresh address, 2) read a value in a marker memory addressed using the refresh address, and 3) selectively refresh, depending on the read value, memory cells addressed using the refresh address; and
wherein the memory cells are organized into a number of rows and a number of columns addressed by corresponding row and column addresses, the memory cells in a row are refreshed at substantially the same time, the refresh address is a row address, and the number of values in the marker memory is equal to the number of rows.

2. The dynamic memory of claim 1, wherein the marker memory is a non-volatile memory.

3. The dynamic memory of claim 1, wherein the second rate is an integral multiple of the first rate.

4. The dynamic memory of claim 1, wherein the subset of memory cells are those memory cells unable to retain data when refreshed at the first rate over all operating temperatures and power supply voltages of the dynamic memory.

5. The dynamic memory of claim 4, wherein the second rate is sufficient for the subset of memory cells to retain data stored therein over all the operating temperatures and the power supply voltages of the dynamic memory.

6. The dynamic memory of claim 5, further comprising a test apparatus, the test apparatus adapted to: 1) test all the memory cells at a refresh test rate to determine which of the memory cells are unable to retain data at the refresh test rate, and 2) enter at least one value in a marking memory identifying the memory cells unable to retain data at the refresh test rate;

wherein the memory cells unable to retain data at the refresh test rate are the subset of memory cells.

7. A method of refreshing a dynamic memory having a plurality of memory cells organized into a number of rows and a number of columns addressed by corresponding row and column addresses, the memory cells in a row are refreshed at substantially the same time, the method comprising the steps of:

a) refreshing all of the memory cells at a first rate;
b) repeating, at a second rate greater than the first rate and for all the rows in the dynamic memory, the steps of:
  b1) generating a refresh row address;
  b2) reading a value in a marker memory addressed using the refresh row address; and
  b3) selectively refreshing, depending on the read value, memory cells in a row addressed using the refresh row address;
wherein the number of values in the marker memory is equal to the number of rows of the dynamic memory.

8. The method of claim 7, further comprising the steps of:
testing all the memory cells at a refresh test rate to determine which, if any, of the memory cells are unable to retain data at the refresh test rate; and
entering at least one value in a marking memory identifying those memory cells unable to retain data at the refresh test rate.

9. The method of claim 7, wherein at least one of the memory cells in the rows of memory cells is refreshed in step b3 is unable to retain data when refreshed at the first rate over all operating temperatures and power supply voltages of the dynamic memory.

10. The method of claim 9, wherein the second rate is sufficient to assure that data stored in the at least one memory cell is maintained over all the operating temperatures and the power supply voltages of the dynamic memory.

11. The method of claim 7, further comprising the steps of:
b4) incrementing the refresh row address; and
b5) repeating steps b1) though b4) until the refresh row address equals or exceeds a specified value.

12. The method of claim 7, wherein the marker memory is a non-volatile memory.

13. The method of claim 7, wherein each value in the marker memory is a multi-bit value.

14. The method of claim 7, wherein the marker memory is loaded with test result data from a data retention test of the dynamic memory using a refresh test rate.

15. The method of claim 7, wherein the second rate is an integral multiple of the first rate.

* * * * *